US012812766B2

(12) United States Patent

Roozitalab et al.

(10) Patent No.: US 12,812,766 B2
(45) Date of Patent: Nov. 24, 2026

(54) SHORT CIRCUIT PROTECTION FOR FIELD OUTPUT TERMINAL ASSEMBLY

(71) Applicant: SWARCO McCain Inc., Vista, CA (US)

(72) Inventors: Reza Roozitalab, Vista, CA (US); Jimi Meshulam, Vista, CA (US); Alejandro Landeros, Vista, CA (US); Ernesto Osuna, Vista, CA (US); Frederick Sim, Vista, CA (US); Luis Baez Pamila, Vista, CA (US)

(73) Assignee: SWARCO McCain Inc., Vista, CA (US)

( * ) Notice: Subject to any disclaimer, the term of this patent is extended or adjusted under 35 U.S.C. 154(b) by 0 days.

(21) Appl. No.: 19/218,614

(22) Filed: May 26, 2025

(65) Prior Publication Data

US 2025/0365854 A1 Nov. 27, 2025

Related U.S. Application Data

(60) Provisional application No. 63/651,979, filed on May 25, 2024.

(51) Int. Cl.
*H05K 1/02* (2006.01)
*H01H 85/20* (2006.01)

(52) U.S. Cl.
CPC ........... *H05K 1/0213* (2013.01); *H01H 85/20* (2013.01); *H01H 2085/2085* (2013.01); *H05K 2201/10181* (2013.01)

(58) Field of Classification Search
CPC ....... H05K 1/0213; H05K 2201/10181; H01H 85/20; H01H 2085/2085
USPC ........................................................... 361/748
See application file for complete search history.

(56) References Cited

U.S. PATENT DOCUMENTS

2010/0163302 A1* 7/2010 Hashikura ........... B60R 16/0238 174/520
2015/0064974 A1* 3/2015 Ozaki .................. H01R 12/523 439/626
2015/0165992 A1* 6/2015 Scheele ................ H01R 9/2491 307/9.1

* cited by examiner

*Primary Examiner* — Binh B Tran
(74) *Attorney, Agent, or Firm* — CP LAW GROUP PC; Cy Bates

(57) ABSTRACT

An integrated field output terminal assembly for traffic controller cabinets includes a circuit board carrying high-density flash-transfer relays and output terminals on a front side, and a short-circuit protection subassembly on a rear side. The protection subassembly has rows of plug-in fuse holders electrically connected through the board to incoming power channels from high-density switch packs, with surge suppressors located between fuse sections. An insulating panel, spaced by standoffs, shields the rear circuitry while providing labeled openings for rapid fuse access. A swing-down mounting bracket lets the board pivot within the cabinet for tool-less inspection and replacement of fuses. By placing circuit protection on the same footprint as the output board, the assembly eliminates separate fuse panels and bulky harnesses, cutting cabinet volume, material cost, and service time while safeguarding switch packs against shorts, lightning, and wiring faults.

19 Claims, 14 Drawing Sheets

SHORT CIRCUIT PROTECTION FOR FIELD OUTPUT TERMINAL ASSEMBLY

CROSS-REFERENCE TO RELATED APPLICATIONS

This application claims benefit of priority with U.S. Provisional Application Ser. No. 63/651,979, filed May 25, 2025; the entire contents of which are hereby incorporated by reference.

BACKGROUND

Field of the Invention

This disclosure relates to a field output terminal assembly used in an advanced transportation controller cabinet, and more particularly to a field output terminal assembly comprising a short circuit protection subassembly.

Description of the Related Art

Traffic-signal controller cabinets, whether built to NEMA TS-2, ATC, or agency-specific standards, serve as weatherproof enclosures for the electronics that drive the red-yellow-green lamp assemblies found at roadway intersections. Inside the cabinet, low-voltage logic generated by the intersection controller is routed through high-density switch packs and delivered to a field output terminal assembly (FOTA). The FOTA is the primary hand-off point between the controller rack and the street-side conductors that run through underground conduit to each signal head, pedestrian indication, or auxiliary device. Because these field conductors are exposed to moisture, corrosion, lightning, accidental shorts, and faulty wiring, industry practice has long been to interpose a dedicated circuit-protection stage between the switch packs and the FOTA. Conventional protection is implemented as a separate fuse or breaker panel, often a 19-inch rackmount "flash transfer" or "load-fuse" subassembly, wired to the FOTA by large harnesses containing dozens of color-coded conductors which can frequently be forty-eight or more per cabinet. Although these remote panels prevent catastrophic damage to the expensive switch packs, they introduce their own drawbacks including additional component cost, substantial harness labor, limited airflow behind the rack, and the permanent loss of valuable cabinet real estate. Technicians must trace individual wires across multiple terminations when replacing a blown fuse, and the sheer number of jumpers increases the chance of wiring errors or loose connections over time. As a result, the legacy architecture of separate circuit-protection hardware tethered to the FOTA by bulky harness assemblies remains serviceable but inefficient, costly, and space-intensive.

SUMMARY

A short circuit protection subassembly used with a field output terminal assembly is described. The short circuit protection subassembly is coupled to a back face of the field output terminal by direct circuit board connection. The short circuit protection subassembly comprises a through-hole connection with a bottom side of a circuit board. A top side of the circuit boards comprises components including high-density flash transfer relays, load terminal block receptacles, and flash program blocks. The short circuit protection subassembly comprises a plurality of fuse holders and a fuse disposed within each of the plurality of fuse holders. The fuse holders include a fuse base and a fuse top.

The short circuit protection subassembly may further comprise an insulation panel disposed in a parallel alignment with the circuit board. The insulation panel is disposed at the back face over the bottom side of the circuit board. The insulation panel comprises panel openings to allow access to components on the back face including the short circuit protection subassembly, suppressors, and connector headers. The insulation panel is configured to eliminate accidental shorting of the bottom side of the circuit board. The insulation panel further includes channel and color indicators for each fuse of the short circuit protection subassembly.

The field output terminal assembly can be fitted with a mounting bracket that secures it in the controller cabinet and is designed to pivot or swing downwards when unlocked. This swing-down bracket mechanism lets technicians conveniently access the back face of the board where the fuses and connectors are located without fully removing the assembly from the rack. Easy access allows blown fuses to be quickly identified and replaced on site while the technician has safe, direct access to all protection components simply by swinging the assembly out.

The short circuit protection subassembly as shown and described herein provides an economical and effective solution to mitigate potential traffic signal interruptions and motorist delays. The short circuit protection subassembly protects the high-density switch packs while allowing for a less costly solution to repair conventional high-density switch pack fuse protection systems, which can be ten times the cost per fuse replacement. The short circuit protection subassembly is easily accessible and does not require additional rack space. This can allow for smaller cabinets or greater workspace for technicians.

By integrating the short-circuit protection directly onto the field output board, the assembly removes the need for a separate rack-mounted fuse panel or bulky wiring looms. The entire protection subassembly shares the same footprint as the output board, which frees up cabinet space and can allow for smaller traffic controller cabinets or additional room for other equipment. This consolidation significantly reduces the overall system size and complexity while cutting down on material and installation costs because no extra fuse boards, enclosures, or large wire harnesses are required.

BRIEF DESCRIPTION OF THE DRAWINGS

Other features, combinations, and embodiments will be appreciated by one having the ordinary level of skill in the art upon a thorough review of the following details and descriptions, particularly when reviewed in conjunction with the drawings, wherein.

DETAILED DESCRIPTION

Figure 1:
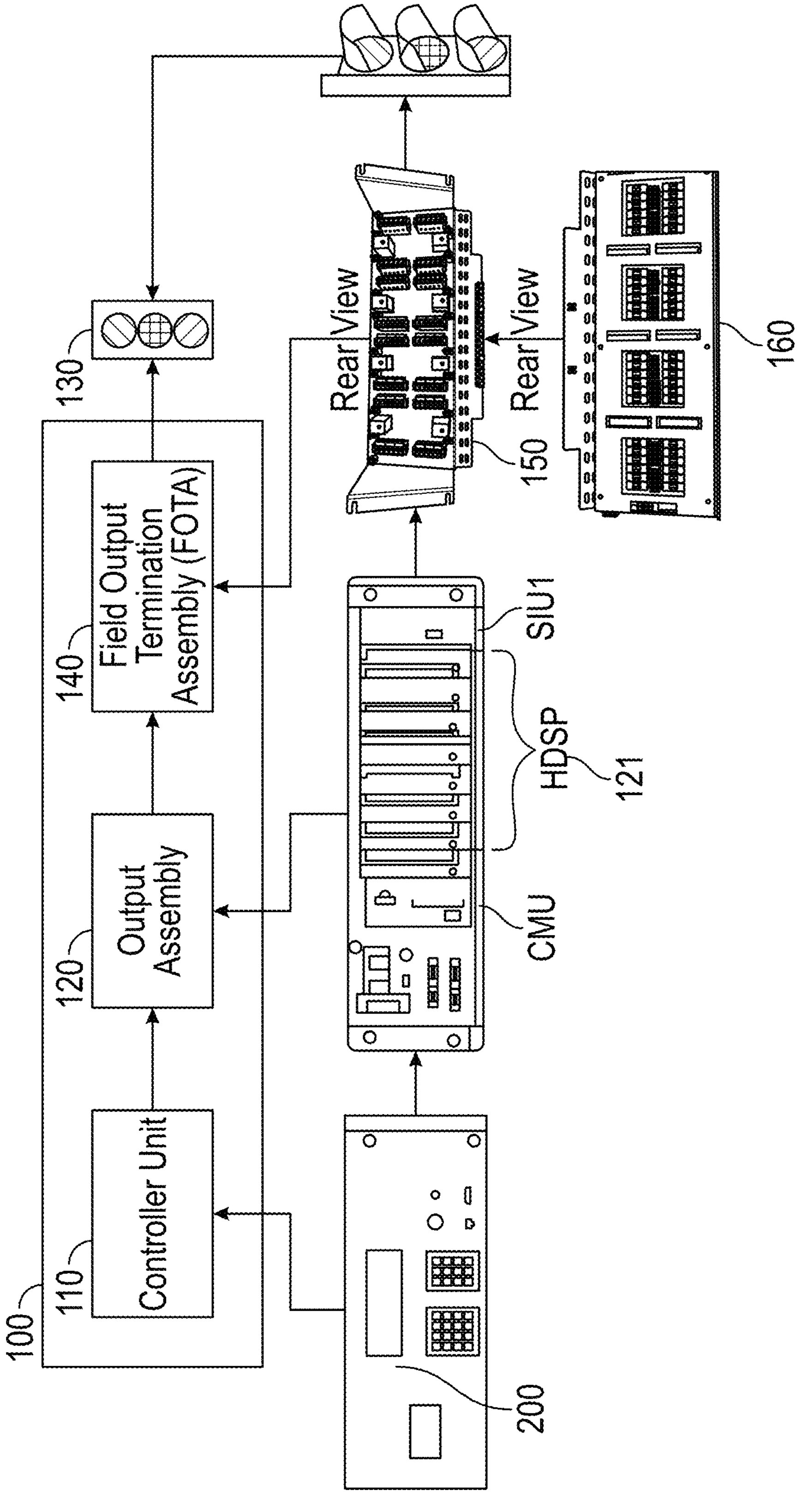
FIG. 1 shows a system block diagram of an advanced transportation cabinet in accordance with a first illustrated embodiment.

For purposes of explanation and not limitation, details and descriptions of certain preferred embodiments are hereinafter provided such that one having ordinary skill in the art may be enabled to make and use the invention. These details and descriptions are representative only of certain preferred embodiments, however, a myriad of other embodiments which will not be expressly described will be readily understood by one having skill in the art upon a thorough review of the instant disclosure. Accordingly, any reviewer of the instant disclosure should interpret the scope of the invention only by the claims, as such scope is not intended to be limited by the embodiments described and illustrated herein.

The features, components, and configurations described in connection with the various embodiments illustrated herein may be combined, interchanged, or otherwise modified in any number of ways without departing from the scope and spirit of the invention. The embodiments are presented by way of example and not limitation, and it is intended that the invention encompasses all such combinations, permutations, and modifications as would be understood by those skilled in the art.

For purposes of illustration clarity, some of the figures do not have reference numbers for every instance of a component. The field output terminal assembly comprises multiples of the same components and is designed compactly together. Having a reference number for every single component would overcrowd the illustrations and reduce the clarity of the disclosure. One having skill in the art will appreciate unmarked components are the same as marked components that share the same form and structure.

For purposes herein, the term "advanced transportation controller cabinet" means an enclosure used in traffic management systems to house and protect assemblies, modules, and components that control traffic signals and other transportation infrastructure.

The term "field output terminal assembly" means

The term "keep-out area" means a designated area on one side of a circuit board where no components are placed to avoid interference with components on an opposite side of the circuit board.

The term "directly connected" means an electrical link in which a component's leads pads, or an intermediary element are fastened straight to the conductive traces of a board, for example by through-hole solder joints, surface-mount pads, or edge-card/mezzanine board-to-board mating, eliminating any intervening wires, harnesses, or flexible cabling.

The term "high-density flash transfer relays" means compact plug-in relay modules that simultaneously reroute many signal circuits into the cabinet's flash safety path, so the selected lamps flash instead of showing normal indications.

The term "load terminal block receptacles" means board-mounted connector housings that accept removable terminal blocks, providing a quick, service-friendly way to plug the field lamp wires into the circuit board.

The term "flash program blocks" means small jumper blocks that technicians insert or remove to choose which lamp color each output channel displays when the system enters flash mode.

The term "suppressors" means surge-protection bars mounted near the fuses that absorb or clamp lightning and switching spikes before they reach sensitive electronics.

The term "header connectors" means dual-row pin headers that receive cable harnesses from the switch packs, feeding each channel through its fuse and on to the field-wiring terminals Unless explicitly defined herein, terms are to be construed in accordance with the plain and ordinary meaning as would be appreciated by one having skill in the art.

General Description of Embodiments

In one general embodiment, a field output terminal assembly is disclosed. The field output terminal assembly comprises a front face and a back face opposite the front face, the front face and the back face each formed by a first major side, a second major side opposite the first major side, a first minor side, and a second minor side opposite the first minor side. A circuit board comprises a top side and a bottom side opposite the top side, the top side facing a direction of the front face and the bottom side facing a direction of the back face. The assembly further comprises a plurality of front-facing componentry electrically coupled to the circuit board at the top side, and a plurality of back-facing componentry electrically coupled to the circuit board at the bottom side. A short circuit protection subassembly is electrically coupled to the circuit board at the bottom side, the short circuit protection subassembly comprising a plurality of fuse holders and a fuse associated with each of the plurality of fuse holders.

In some embodiments, the front-facing componentry may further comprise high-density flash transfer relays, load terminal block receptacles, and flash program blocks.

In some embodiments, the back-facing componentry may further comprise suppressors and header connectors.

In some embodiments, the assembly may further comprise a plurality of keep-out areas on the top side of the circuit board wherein the plurality of keep-out areas corresponds to through-hole connections of the short circuit protection subassembly.

In some embodiments, the short circuit protection subassembly may be directly connected to the circuit board.

In some embodiments, the short circuit protection subassembly may be coupled to the circuit board via through-hole connectors.

In some embodiments the plurality of fuse holders may be coupled to the circuit board via through-hole connectors.

In some embodiments, the plurality of fuse holders may form a plurality of fuse sections disposed serially along the bottom side of the circuit board from the first minor side to the second minor side. Each of the plurality of fuse sections may comprise a first fuse row and a second fuse row, the first fuse row and the second fuse each extending linearly from the first minor side to the second minor side. One or more header connectors may be disposed between each of the first fuse row and the second fuse row, wherein the one or more header connectors are configured to receive output from a high-density switch pack. The first fuse row may be vertically aligned with the second fuse row/The plurality of back-facing componentry may include a plurality of suppressors, each of the plurality of suppressors comprising an elongated profile, wherein neighboring fuse sections are segregated by a pair of the plurality of suppressors. Each pair of suppressors may be vertically aligned in a lengthwise direction to create an elongated barrier between each of the plurality of fuse sections. The lengthwise direction may be orthogonal to each of the first fuse row and the second fuse row.

In some embodiments, the assembly may further comprise an insulation panel coupled to the circuit board, wherein the insulation panel comprises a material configured to reduce or eliminate electrical conductivity. The insulation panel may be coupled to the circuit board at the bottom side. The insulation panel may be coupled to the circuit board via insulation standoffs. The insulation panel may comprise a parallel formation with the circuit board. The insulation panel may further comprise panel openings wherein the short circuit protection subassembly is accessible through the panel openings. The insulation panel may further comprise a channel indicator and a color indicator for each fuse of the short circuit protection subassembly.

In some embodiments, the front-facing componentry may further comprise a plurality of high-density flash transfer relays, wherein each of the plurality of high-density flash transfer relays is disposed adjacent to one of the first major side and the second major side. The plurality of high-density flash transfer relays may form a plurality of vertical pairs extending vertically from the first major side to the second major side. Disposed between each of the plurality of vertical pairs of high-density flash transfer relays may comprise a keep-out area. Each of the keep-out areas may correspond to through-hole connections of the short circuit protection subassembly.

In some embodiments, the assembly may further comprise a bracket comprising a top surface and a bottom surface opposite the top surface, wherein the bracket is disposed over the top side of the circuit board. The bracket may further comprise bracket openings wherein the front-facing componentry is accessible through the bracket openings. The bracket may further comprise a first flange extending from the first minor side away from the back face, and a second flange extending from the second minor side away from the back face.

Manufacturing

Each of the components of the field output terminal assembly and short circuit protection subassembly described herein may be manufactured and/or assembled in accordance with the conventional knowledge and level of a person having skill in the art.

The fuse base can be obtained commercially, for example and without limitation Wurth Elektronik #696108003002. Alternatively, the fuse base can be customized in accordance with the level and knowledge of one having skill in the art.

The fuse top can be obtained commercially, for example and without limitation Wurth Elektronik #696122003001. Alternatively, the fuse top can be customized in accordance with the level and knowledge of one having skill in the art.

The fuse can be obtained commercially, for example and without limitation Bussman #GDA-1A. Alternatively, the fuse can be customized in accordance with the level and knowledge of one having skill in the art.

The high-density flash transfer relay can be obtained commercially, for example and without limitation Struthers-Dunn #21XBXHL-48 VDC. Alternatively, the relay can be customized in accordance with the level and knowledge of one having skill in the art.

The flash program block can be obtained commercially, for example and without limitation MOLEX #Mar. 6, 1062 and #Mar. 6, 2061. Alternatively, the block can be customized in accordance with the level and knowledge of one having skill in the art.

Each of the components of the assembly and related subassembly described herein may be manufactured and/or assembled in accordance with the conventional knowledge and level of a person having skill in the art.

While various details, features, combinations are described in the illustrated embodiments, one having skill in the art will appreciate a myriad of possible alternative combinations and arrangements of the features disclosed herein. As such, the descriptions are intended to be enabling only, and non-limiting. Instead, the spirit and scope of the invention is set forth in the appended claims.

Illustrated Embodiments

Now turning to the drawings, FIG. 1 shows a system block diagram of an advanced transportation cabinet (100) in accordance with a first illustrated embodiment. The advanced transportation cabinet comprises a myriad of assemblies and subassemblies including a controller unit (110), an output assembly (120), and a field output terminal assembly (140). The controller unit collects and processes intersection detectors and sensor information and changes of right-of-way to different intersection approaches based on algorithms and logic contained therein. The controller unit sends low-voltage logic signals to the output assembly to be converted into a voltage level that can power intersection signal lamps (130). Voltage levels depend on architecture and can include configurations such as 120 VAC or 48 VDC. The conversion of the low voltage signal logics to an adequate voltage level to power the signal lamps is performed by high-density switch packs (121). The high-density switch packs output the converted electric power to the field output terminal assembly where the electric power is distributed to the signal lamps to properly indicate signals such as Red, Yellow, Green, Walk, and DO NOT WALK.

Figure 2:
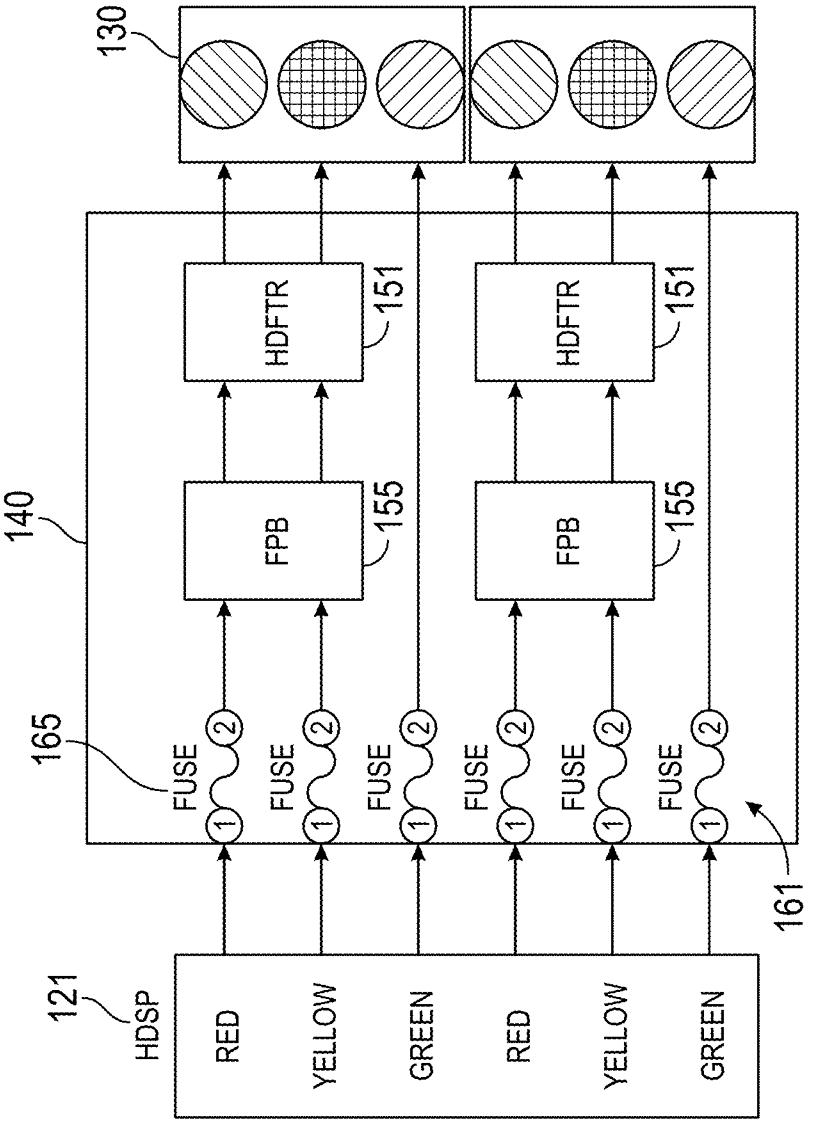
FIG. 2 shows system block diagram of high-density switch packs electrically coupled to a field output terminal assembly according to the first illustrated embodiment.
Figure 3:
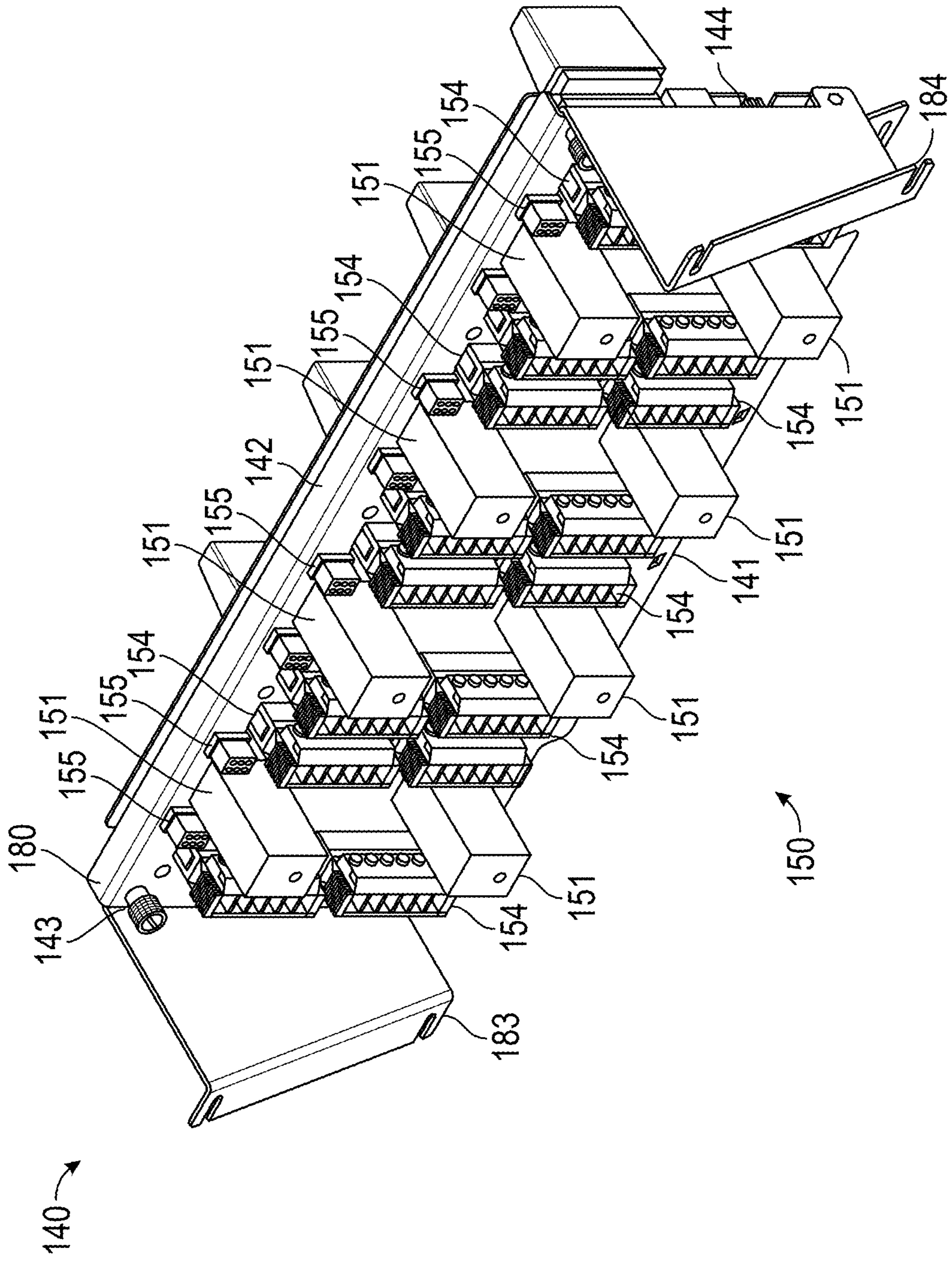
FIG. 3 shows a perspective view of a front face of the field output terminal assembly according to the first illustrated embodiment.
Figure 4:
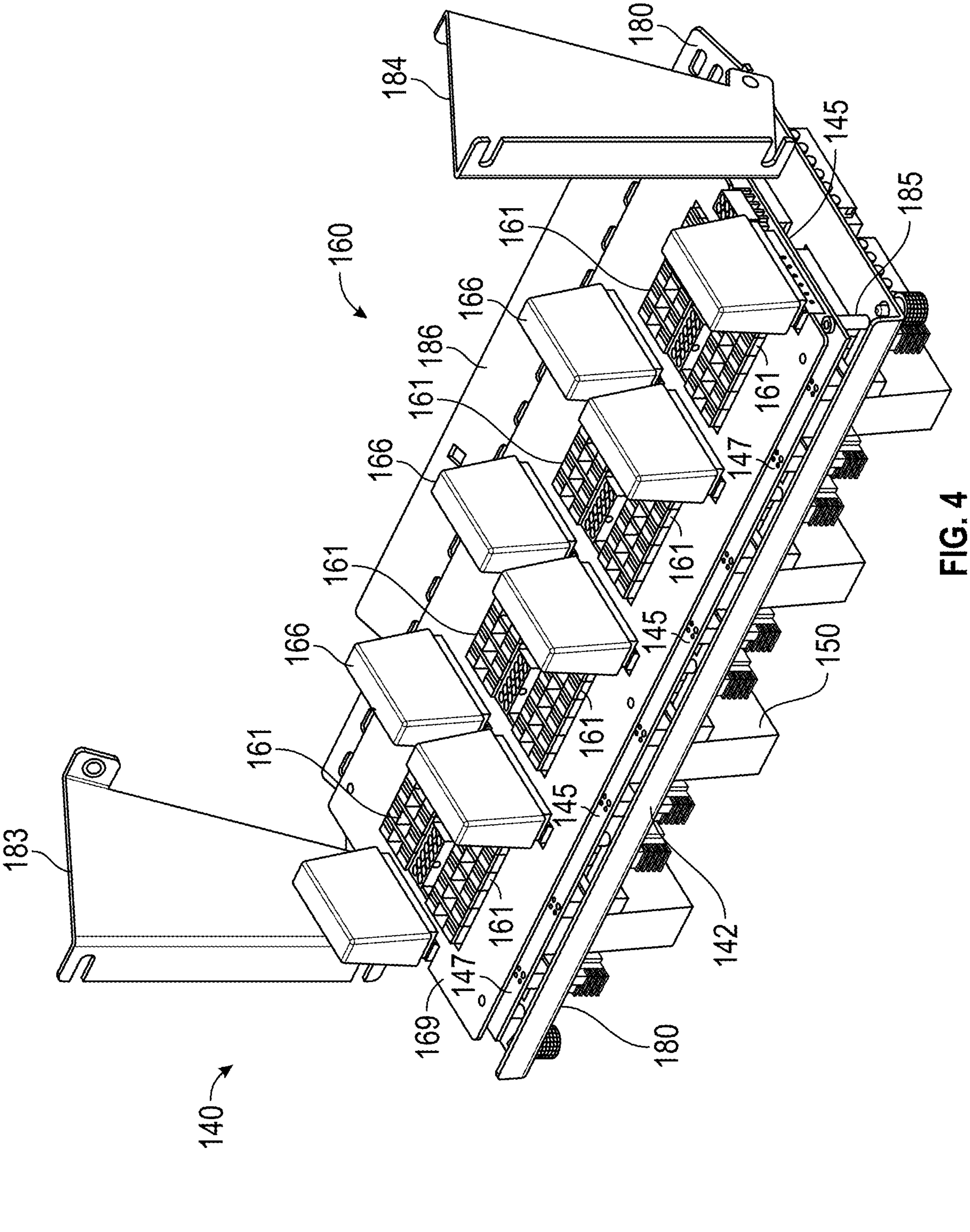
FIG. 4 shows a perspective view of a back face of the field output terminal assembly according to the first illustrated embodiment.
Figure 5:
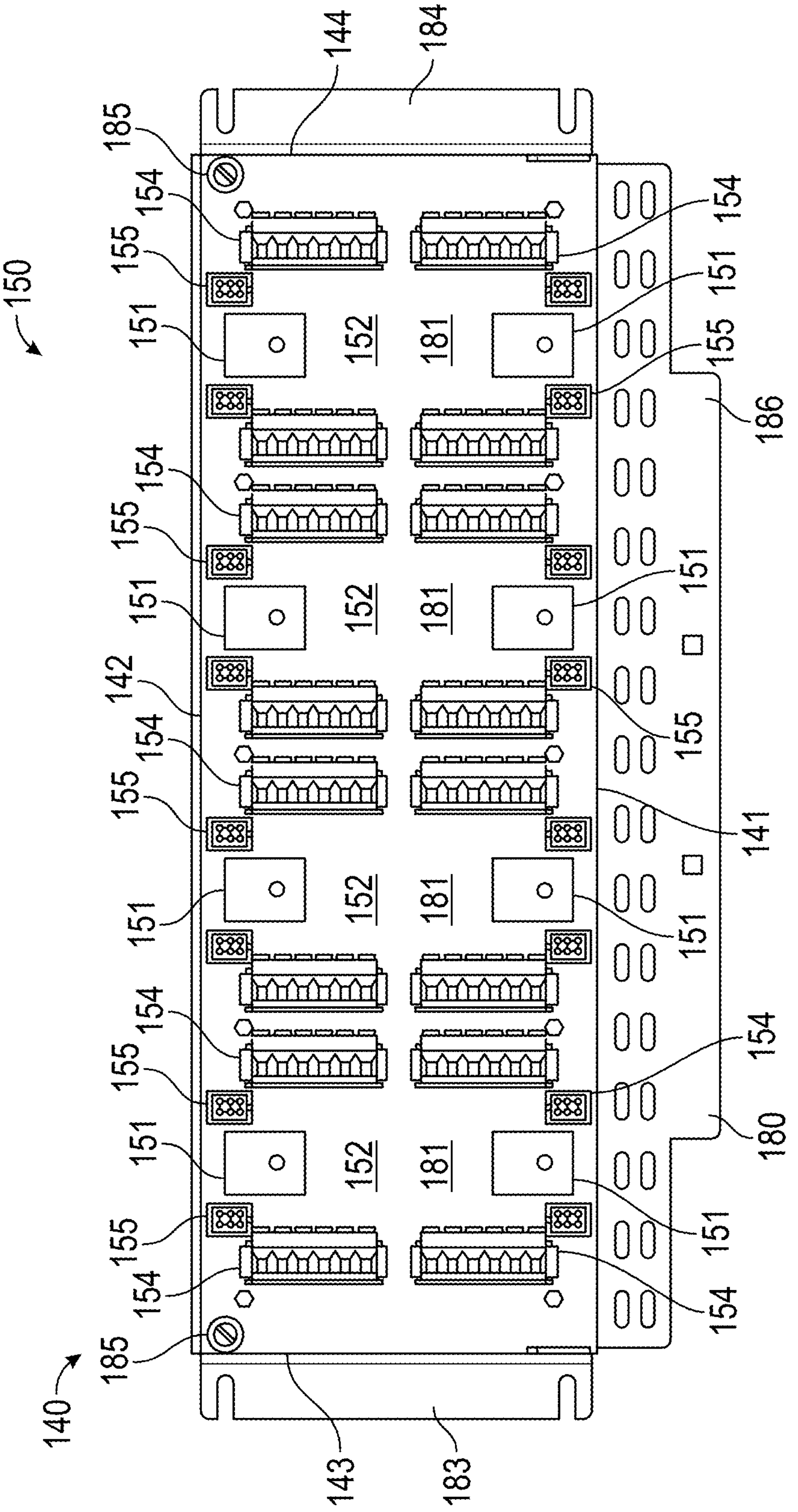
FIG. 5 shows a front view of the field output terminal assembly according to the first illustrated embodiment.
Figure 6:
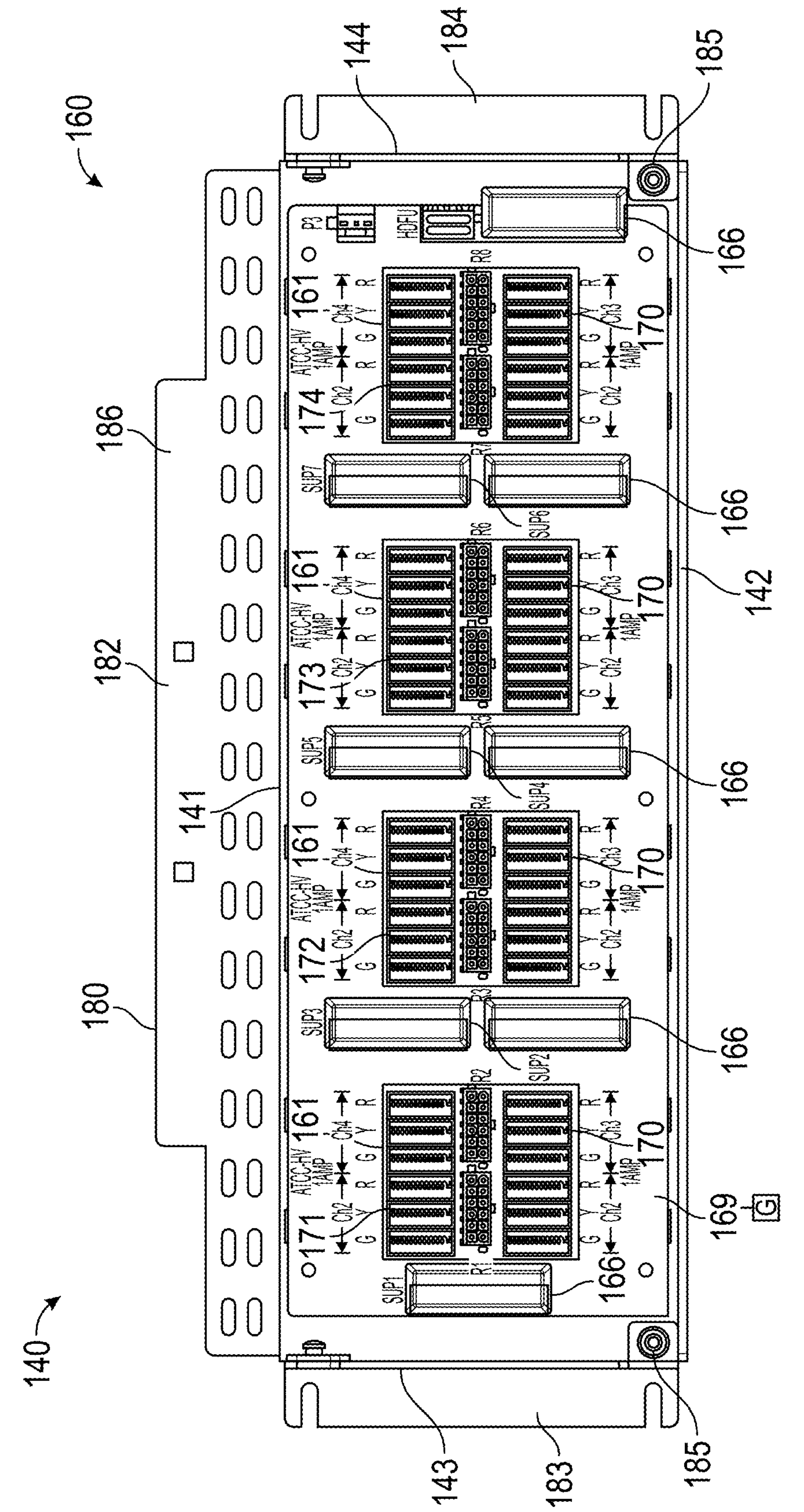
FIG. 6 shows a back view of the field output terminal assembly according to the first illustrated embodiment.
Figure 7:
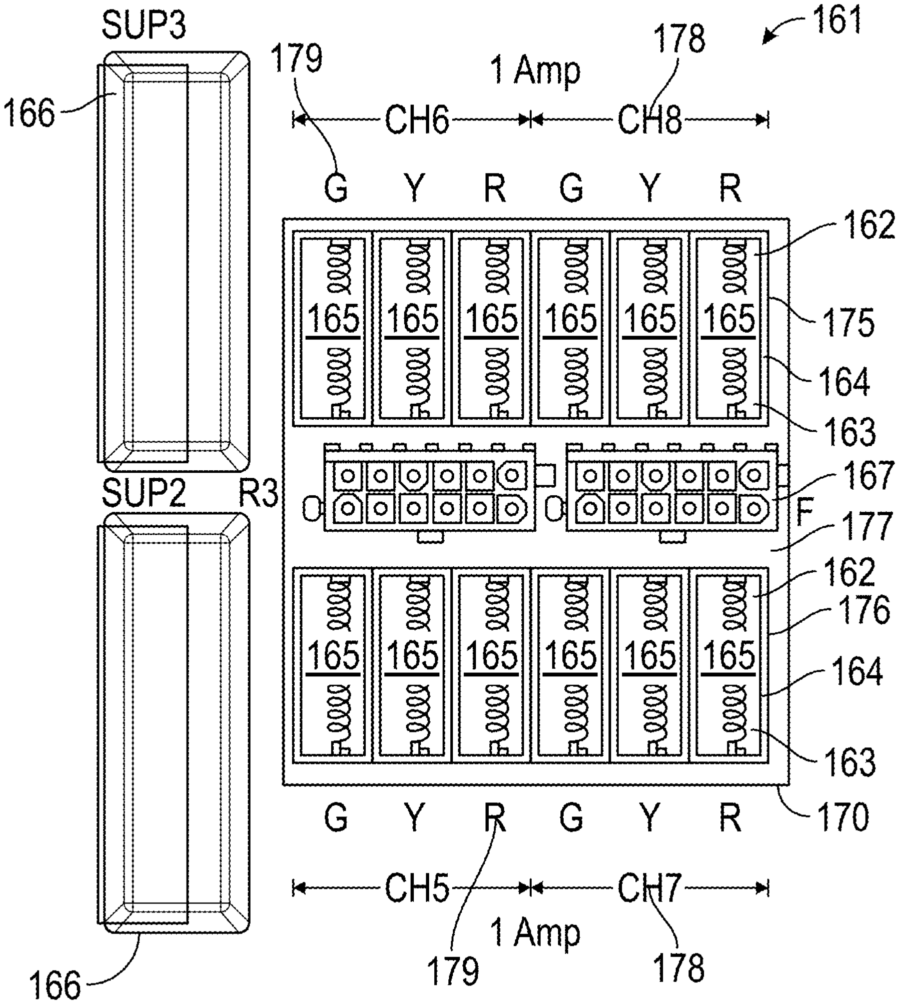
FIG. 7 shows a close-up view of a short circuit protection subassembly according to the first illustrated embodiment.
Figure 8:
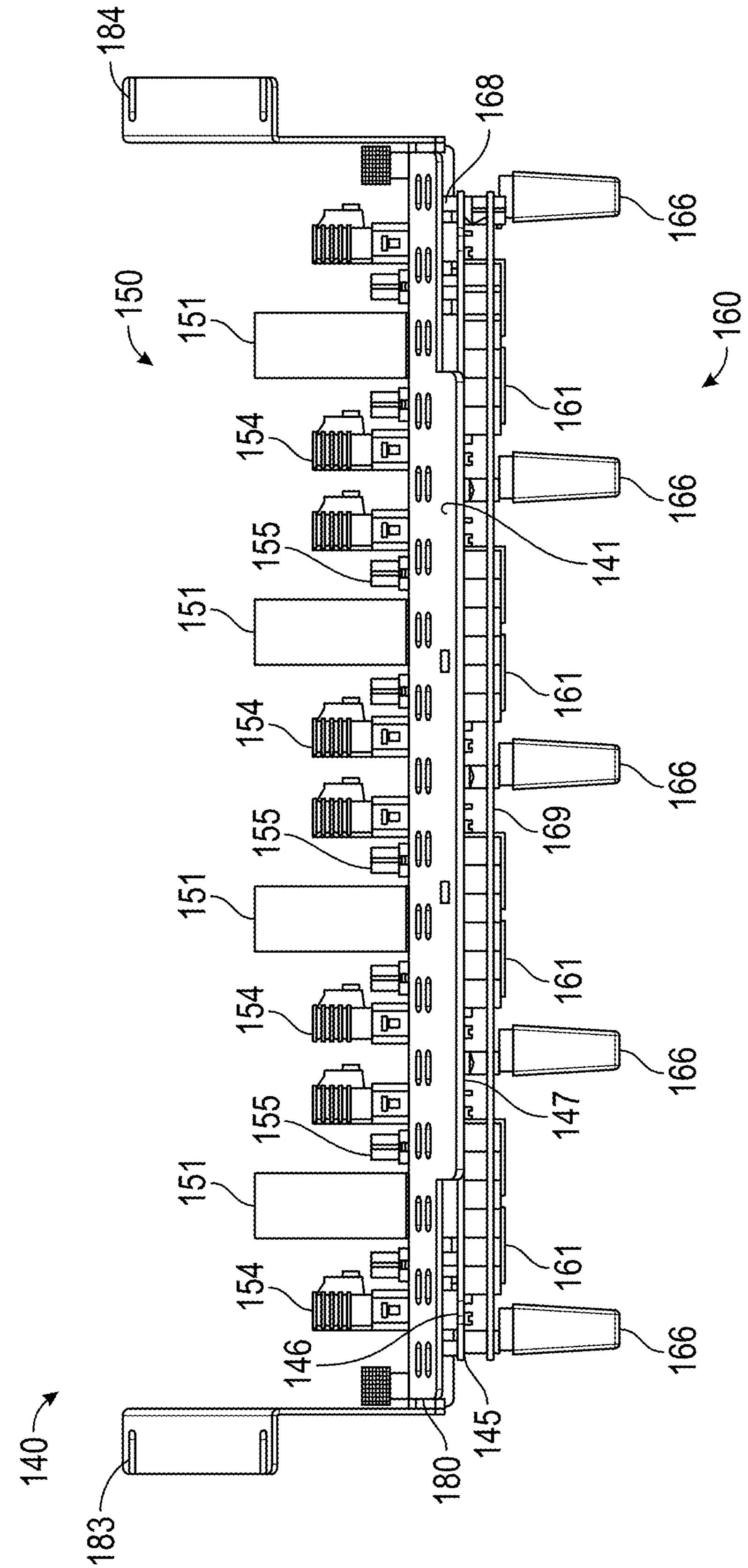
FIG. 8 shows a top view of the field output terminal assembly according to the first illustrated embodiment.
Figure 9:
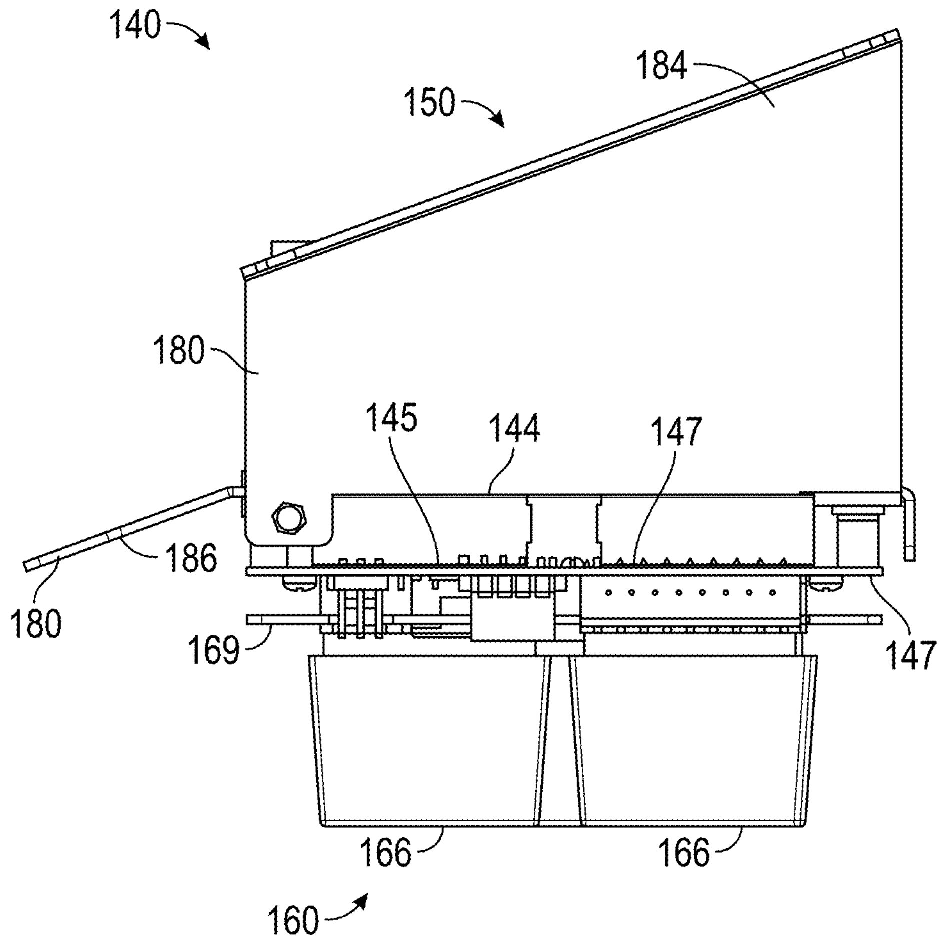
FIG. 9 shows a side view of the field output terminal assembly according to the first illustrated embodiment.
Figure 10:
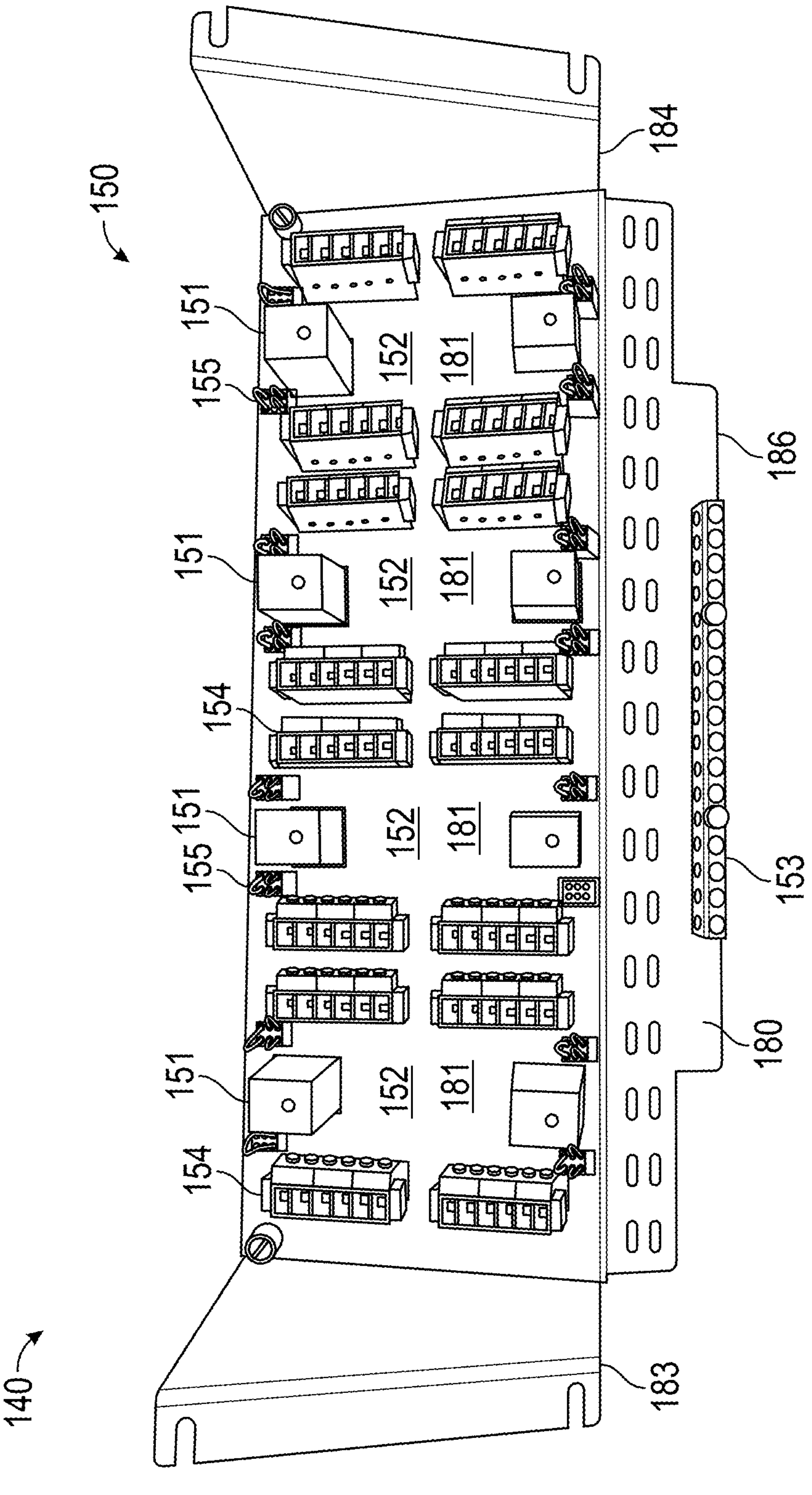
FIG. 10 shows a photograph of a front view of the field output terminal assembly according to the first illustrated embodiment.
Figure 11:
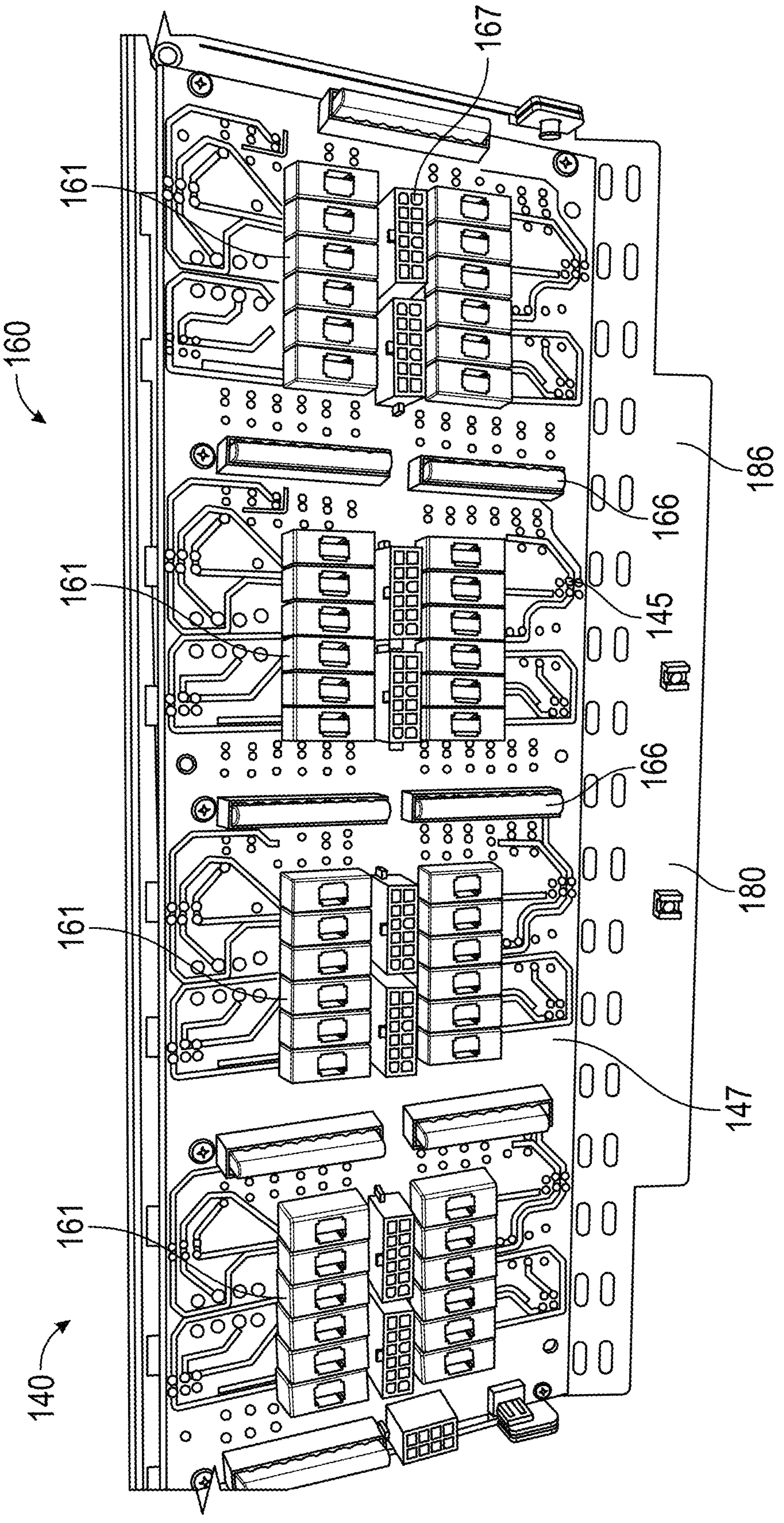
FIG. 11 shows a photograph of a back view of the field output terminal assembly according to the first illustrated embodiment.
Figure 12:
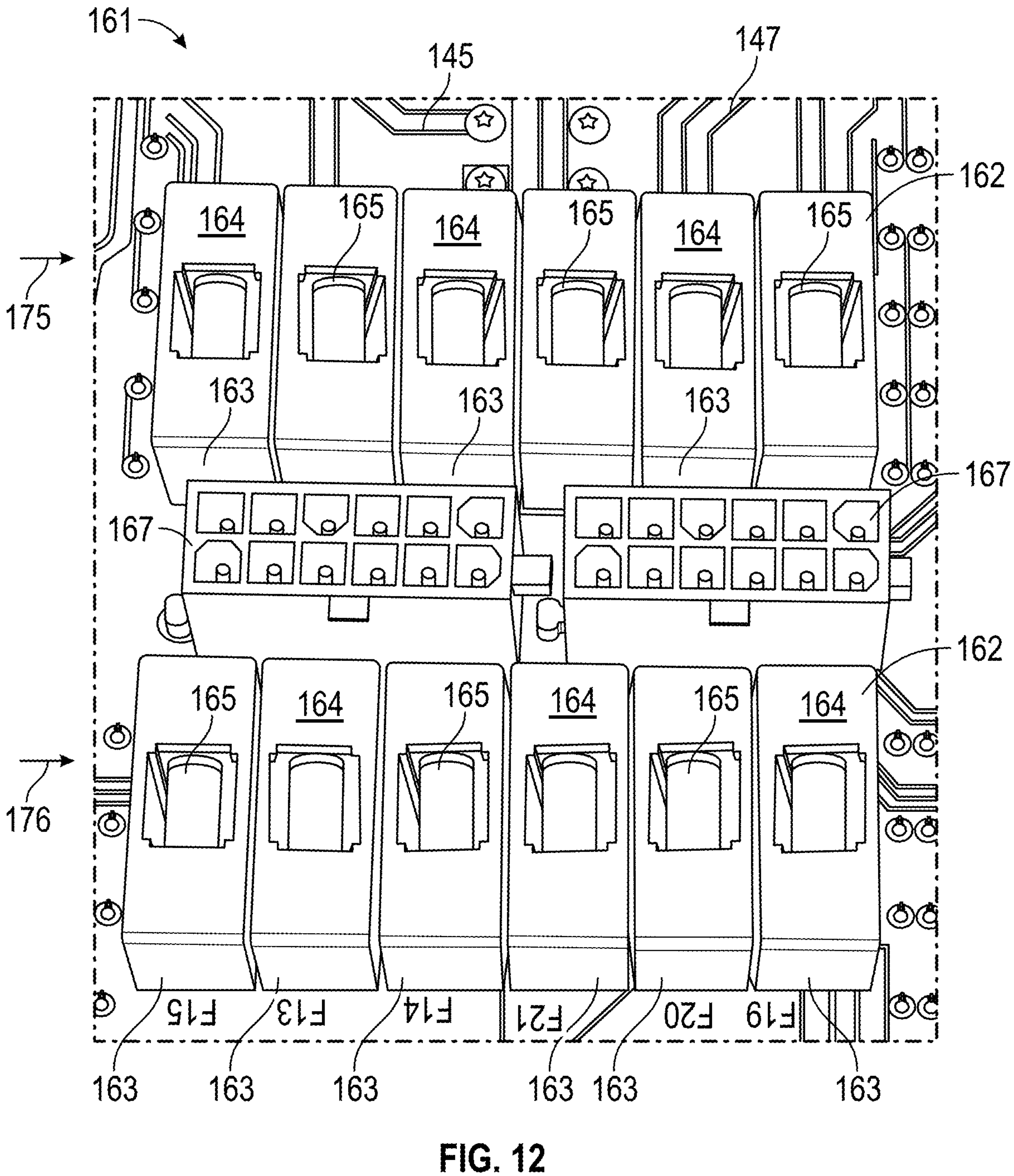
FIG. 12 shows a photograph of a close-up view of the short circuit protection subassembly according to the first illustrated embodiment.
Figure 13:
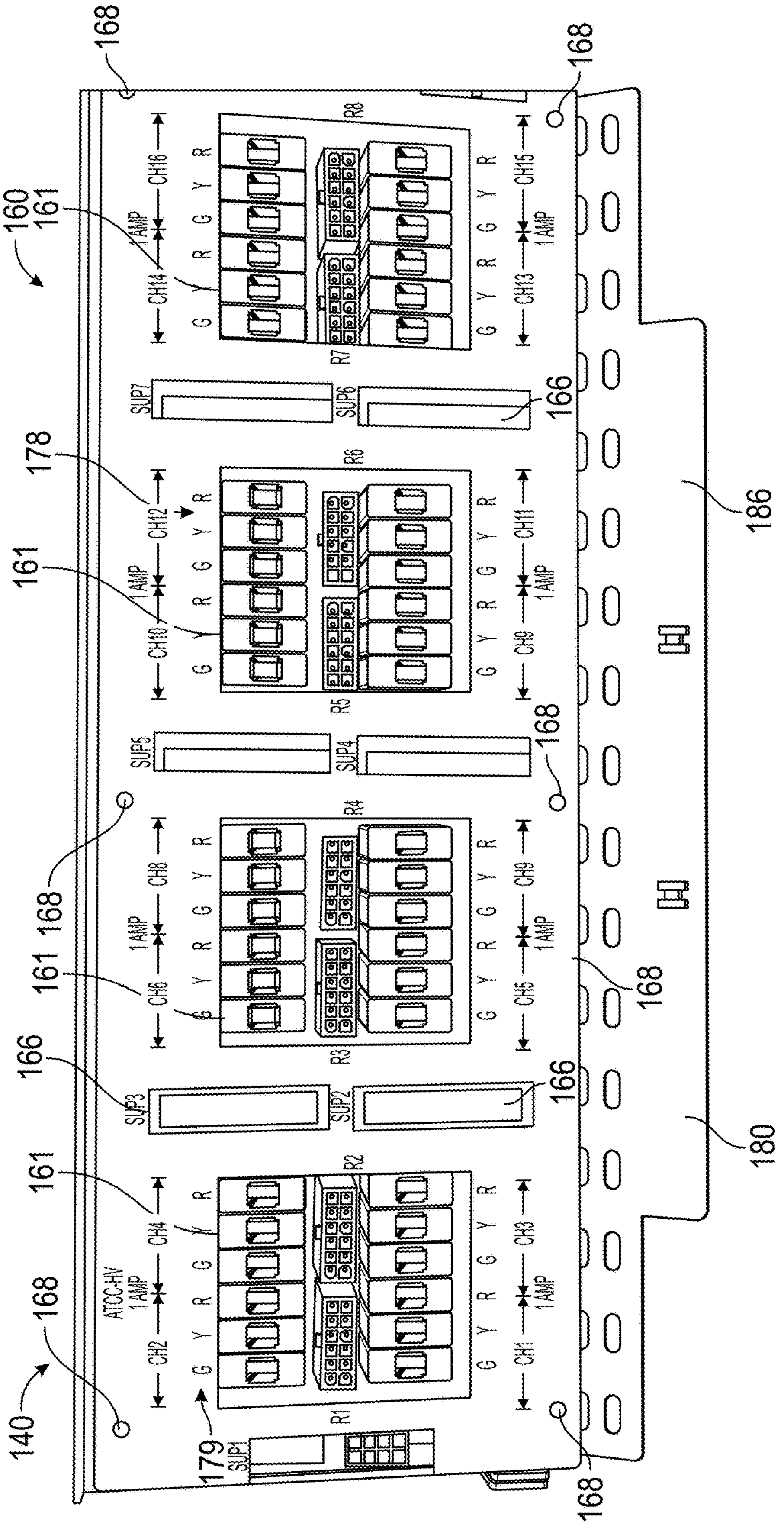
FIG. 13 shows a photograph of an alternate back view of the field output terminal assembly according to the first illustrated embodiment.
Figure 14:
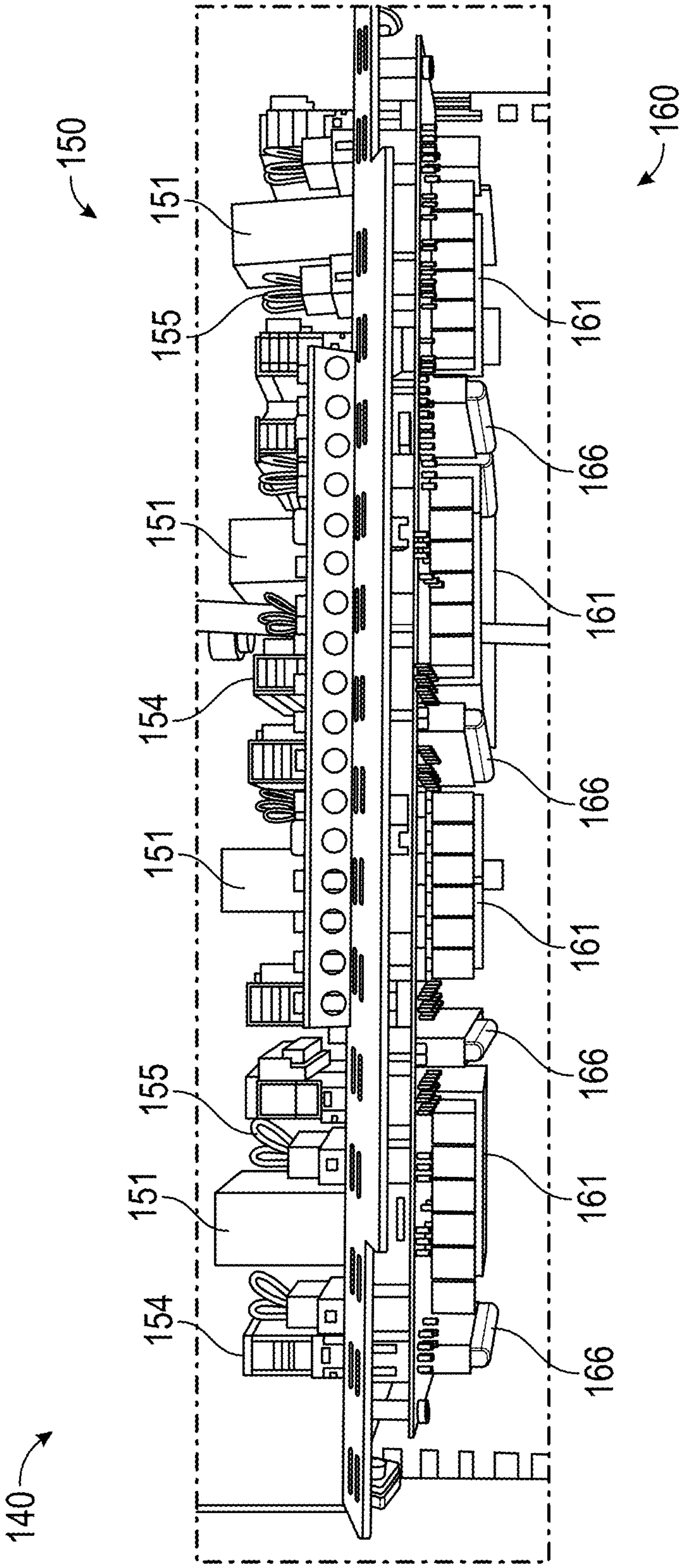
FIG. 14 shows a top view of the field output terminal assembly according to the first illustrated embodiment.

FIG. 2 shows a system block diagram of high-density switch packs (121) electrically coupled to a field output terminal assembly (140) according to the first illustrated embodiment. The high-density switch packs convert the low voltage logic signal to a voltage level to power the signal lamps (130). The power signal output by each of the high-density switch pack is sent initially to a short circuit protection subassembly (161) integrated with the field output terminal assembly. The short circuit protection subassembly comprises a plurality of fuses (165) wherein each fuse corresponds to each power signal output of the high-density switch packs. A plurality of high-density flash transfer relays (151) and a plurality of flash program blocks (155) are used to control and select colors of the signal lamps energized by the power signals.

FIG. 3-14 show the field output terminal assembly (140) according to the first illustrated embodiment. The field output terminal assembly comprises a front face (150) and a back face (160) opposite the front face. The field output terminal assembly further comprises a first major side (141), a second major side (142) opposite the first major side, a first minor side (143), and a second minor side (144) opposite the first minor side. The field output terminal assembly includes a bracket (180) for installing the field output terminal assembly into a rack. The front face includes high-density flash transfer relays (151), load terminal block receptacles (154), and flash program blocks (155). The back face includes suppressors (166), header connectors (167), and a short circuit protection subassembly (161). Components of the front face and back face share a same circuit board (145) of the field output terminal assembly wherein components of the front face are disposed on a top side (146) of the circuit board and components of the back face are disposed on a bottom side (147) of the circuit board. The field output terminal assembly incorporates the short circuit protection subassembly directly on the circuit board's back side, eliminating the need for separate wired fuse panels or harnesses.

The short circuit protection subassembly (161) is coupled on the back face (160) of the field output terminal assembly via through-hole connections to the circuit board (145). The short circuit protection subassembly is configured to protect the high-density switch packs (FIG. 1; 121) from damage by field short circuit, electric surges, lightning, and the like. The short circuit protection subassembly comprises a plurality of fuse holders (162) and a fuse (165) associated with each of the plurality of fuse holders. The plurality of fuse holders is directly connected to the circuit board devoid of wires or harnesses. Each of the plurality of fuse holders and associated fuse corresponds to protecting one of the high-density switch packs. If a damaging event were to occur, the fuse corresponding to the high-density switch will fail instead of the high-density switch pack itself. Given the cost of the high-density switch packs can be orders of magnitude greater than the fuse, there is a significant potential for reducing time and costs in replacing damaged parts. The short circuit protection subassembly being directly coupled to the circuit board saves rackmount space by removing the requirement for a separate protection circuit module. The bracket (180) of the field output terminal assembly is configured to swing downwards when mounted to allow for easy access to the short circuit protection subassembly and other componentry on the back face.

The short circuit protection subassembly (161) comprises a plurality of fuse sections (170) disposed serially along the bottom side (147) of the circuit board (145) from the first minor side (143) to the second minor side (144). As shown, the plurality of fuse sections comprises a first section (171), a second section (172), a third section (173), and a fourth section (174). Other numbers of sections can be utilized depending on circuit layout on system requirements as can be appreciated by one having skill in the art. Each of the plurality of fuse sections comprises a first fuse row (175) and a second fuse row (176). Disposed between the first and second fuse rows are header connectors (167) for receiving the high-density switch pack outputs. The first fuse row and the second fuse row are aligned vertically to each other to establish a compact layout. Other layouts and configurations can also be utilized without deviating from the scope of the invention. The plurality of fuse sections is segregated from each other by a pair of suppressors (166). Each of the suppressors comprises an elongated form factor wherein the pair of suppressors are vertically aligned lengthwise to create an elongated barrier between each of the plurality of fuse sections. Each pair of suppressors is in a parallel relationship with each other pair of suppressors. Additionally, each pair of suppressors can be characterized as being orthogonal to the first and second fuse rows of each of the plurality of fuse sections.

The short circuit protection subassembly (161) comprises the plurality of fuse holders (162) that are through-hole mounted to the bottom side (147) of the circuit board (145). A fuse (165) is configured to nest within each of the plurality of fuse holders. Each fuse holder comprises a fuse base (163) and a fuse top (164). The fuse top retains the fuse inside the fuse base and is removable without a tool.

The short circuit protection subassembly (161) further comprises an insulation panel (169) to prevent accidental contact with the bottom side (147) circuit board (145). The insulation panel couples to the circuit board with insulation standoffs (168) which align the insulation panel in a parallel relationship with the circuit board. The insulation panel comprises panel openings (177) to allow for accessibility of componentry on the back face (160). Said componentry includes the suppressors (166), the header connectors (167), and the short circuit protection subassembly. The insulation panel further comprises channel indicators (178) and color indicators (179) for each fuse of the short circuit protection subassembly. The insulation panel comprises a material configured to reduce or eliminate electrical conductivity.

The front face (150) of the field output terminal assembly (140) comprises a componentry layout on the top side (146) of the circuit board (145) to accommodate the short circuit protection subassembly (161) on the bottom side (147) of said circuit board. The high-density flash transfer relays (151) and the flash program blocks (155) are disposed adjacent to either the first major side (141) or the second major side (142) to form keep-out areas (152) between each vertical pair of high-density flash transfer relays. The keep-out areas on the top side of the circuit board correspond to the through-hole connections of the short circuit protection subassembly on the bottom side of said circuit board.

The bracket (180) is used for mounting and rotating the field output terminal assembly (140) when installed inside an advanced transportation controller cabinet. The bracket comprises a top surface (181) and a bottom surface (182) opposite the top surface. The bracket is disposed over the top side (146) of the circuit board (145) and is coupled therewith using bracket standoffs (185) to prevent the bracket from creating a short circuit. The bracket includes bracket openings to allow the front face componentry to be accessible. This includes the high-density flash transfer relays (151), the load terminal block receptacles (154), and the flash program blocks (155). The keep-out areas (152) of the top side of the circuit board are covered by the top surface of the bracket. The bracket further comprises a first flange (183) extending from the first minor side (143) and a second flange (184) extending from the second minor side (144). The first and second flanges extend upwards away from the back face (160) when the field output terminal assembly is normally installed on a rack. The first and second flanges are configured to allow for rotation of the field output terminal assembly to provide access to the back face when access to components such as the suppressors (166) or the short circuit protection subassembly (161) is needed. The bracket further comprises a slanted edge (186) disposed at the first major side (141) of the field output terminal assembly. The slanted edge tapers downwards towards the back face and comprises an AC copper bus (153).

FEATURE LIST advanced transportation controller cabinet (100)
controller unit (110)

output assembly (120)
high density switch pack (121)
signal lamps (130)
field output terminal assembly (140)
first major side (141)
second major side (142)
first minor side (143)
second minor side (144)
circuit board (145)
top side (146)
bottom side (147)
front face (150)
high-density flash transfer relay (151)
keep-out area (152)
AC copper bus (153)
load terminal block receptacle (154)
flash program block (155)
back face (160)
short circuit protection subassembly (161)
fuse holder (162)
fuse base (163)
fuse top (164)
fuse (165)
suppressors (166)
header connector (167)
insulation standoff (168)
insulation panel (169)
plurality of fuse sections (170)
first section (171)
second section (172)
third section (173)
fourth section (174)
first fuse row (175)
second fuse row (176)
panel opening (177)
channel indicator (178)
color indicator (179)
bracket (180)
top surface (181)
bottom surface (182)
first flange (183)
second flange (184)
bracket standoff (185)
slanted edge (186)

What is claimed is:

1. A field output terminal assembly, comprising:

a front face and a back face opposite the front face, the front face and the back face each formed by a first major side, a second major side opposite the first major side, a first minor side, and a second minor side opposite the first minor side;

a circuit board comprising a top side and a bottom side opposite the top side, the top side facing a direction of the front face and the bottom side facing a direction of the back face;

a plurality of front-facing componentry electrically coupled to the circuit board at the top side, the front-facing componentry comprising high-density flash transfer relays, load terminal block receptacles, and flash program blocks;

a plurality of back-facing componentry electrically coupled to the circuit board at the bottom side;

a short circuit protection subassembly electrically coupled to the circuit board at the bottom side, the short circuit protection subassembly comprising a plurality of fuse holders and a fuse associated with each of the plurality of fuse holders.

2. The field output terminal assembly of claim 1, wherein the back-facing componentry further comprises suppressors and header connectors.

3. The field output terminal assembly of claim 1, further comprising a plurality of keep-out areas on the top side of the circuit board wherein the plurality of keep-out areas corresponds to through-hole connections of the short circuit protection subassembly.

4. The field output terminal assembly of claim 1, wherein the short circuit protection subassembly couples to the circuit board via through-hole connectors.

5. The field output terminal assembly of claim 1, wherein the plurality of fuse holders forms a plurality of fuse sections disposed serially along the bottom side of the circuit board from the first minor side to the second minor side.

6. The field output terminal assembly of claim 5, wherein each of the plurality of fuse sections comprises a first fuse row and a second fuse row, the first fuse row and the second fuse each extending linearly from the first minor side to the second minor side.

7. The field output terminal assembly of claim 6, wherein the plurality of back-facing componentry includes a plurality of suppressors, each of the plurality of suppressors comprising an elongated profile, wherein neighboring fuse sections are segregated by a pair of the plurality of suppressors.

8. The field output terminal assembly of claim 7, wherein each pair of suppressors is vertically aligned in a lengthwise direction to create an elongated barrier between each of the plurality of fuse sections.

9. The field output terminal assembly of claim 8, wherein the lengthwise direction is orthogonal to each of the first fuse row and the second fuse row.

10. The field output terminal assembly of claim 6, further comprising one or more header connectors disposed between each of the first fuse row and the second fuse row, wherein the one or more header connectors are configured to receive output from a high-density switch pack.

11. The field output terminal assembly of claim 1, further comprising an insulation panel coupled to the circuit board, wherein the insulation panel comprises a material configured to reduce or eliminate electrical conductivity.

12. The field output terminal assembly of claim 11, wherein the insulation panel is coupled to the circuit board at the bottom side.

13. The field output terminal assembly of claim 11, the insulation panel further comprising panel openings wherein the short circuit protection subassembly is accessible through the panel openings.

14. The field output terminal assembly of claim 11, the insulation panel further comprising a channel indicator and a color indicator for each fuse of the short circuit protection subassembly.

15. The field output terminal assembly of claim 1, the front-facing componentry further comprising a plurality of high-density flash transfer relays, wherein each of the plurality of high-density flash transfer relays is disposed adjacent to one of the first major side and the second major side.

16. The field output terminal assembly of claim 15, wherein the plurality of high-density flash transfer relays form a plurality of vertical pairs extending vertically from the first major side to the second major side.

17. The field output terminal assembly of claim 1, further comprising a bracket comprising a top surface and a bottom surface opposite the top surface, wherein the bracket is disposed over the top side of the circuit board.

18. The field output terminal assembly of claim 17, the bracket further comprising bracket openings wherein the front-facing componentry is accessible through the bracket openings.

19. The field output terminal assembly of claim 17, the bracket further comprising a first flange extending from the first minor side away from the back face, and a second flange extending from the second minor side away from the back face.

* * * * *